United States Patent
Struble

(10) Patent No.: US 7,263,337 B2
(45) Date of Patent: Aug. 28, 2007

(54) CIRCUIT FOR BOOSTING DC VOLTAGE

(75) Inventor: Wayne M. Struble, Franklin, MA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 269 days.

(21) Appl. No.: 10/643,750

(22) Filed: Aug. 18, 2003

(65) Prior Publication Data

US 2004/0229577 A1 Nov. 18, 2004

Related U.S. Application Data

(60) Provisional application No. 60/471,109, filed on May 16, 2003.

(51) Int. Cl.
*H04B 1/44* (2006.01)
(52) U.S. Cl. .......................... 455/78; 333/101
(58) Field of Classification Search ............... 455/73, 455/78–80, 82–83; 333/100–101, 103; 327/365
See application file for complete search history.

(56) References Cited

U.S. PATENT DOCUMENTS

| 4,639,614 A | 1/1987 | Basile |
| 4,987,392 A | 1/1991 | Clark et al. |
| 5,047,674 A | 9/1991 | Clark et al. |
| 5,220,679 A * | 6/1993 | Zametzer et al. ............. 455/78 |
| 6,369,641 B1 | 4/2002 | McNamara et al. |
| 2003/0090313 A1 | 5/2003 | Burgener et al. |

FOREIGN PATENT DOCUMENTS

WO  WO 02/061876 A1  8/2002

OTHER PUBLICATIONS

Numata et al. "A high-power-handling GSM switch IC with new adaptive-control-voltage-generator circuit scheme," 2003 IEEE Radio Frequency Integrated Circuits (RFIC) Symposium, Digest of Papers, Philadelphia, PA, Jun. 8-10, 2003, pp. 233-236.
Miyatsuji et al. "A GaAs High-Power RF Single-Pole Double-Throw Switch IC for Digital Mobile Communication System," IEEE International Solid State Circuits Conference, New York, vol. 37, Feb. 1, 1994, pp. 34-35, 305.
Jones, S. "Reduce Insertion Loss in GaAs FET RF Switch Using Negative Voltage Derived from RF Output," Motorola Technical Developments, Motorola, Inc., Schaumburg, IL, vol. 41, May 2000, pp. 205-206.
"A High-Power-Handling GSM Switch IC With New Adaptive-Control-Voltage-Generator Circuit Scheme" by Keiichi Numata et al., 2003 IEEE Radio Frequency Intergrated Circuits (RFIC) Symposium, Philadelphia, PA, Jun. 8, 2003.

* cited by examiner

*Primary Examiner*—Nguyen T. Vo
(74) *Attorney, Agent, or Firm*—Bever Hoffman Harms LLP

(57) ABSTRACT

A bias circuit that includes a rectifier having an input, an output and a DC control voltage input, wherein the rectifier is configured to produce the rectifier output, while providing a substantially high input impedance at the rectifier input, a rectified voltage from an alternating input signal applied at the rectifier input; and a bias extractor having an extractor input, a control voltage input and an extractor output, coupled to the rectifier output, and being configured to produce at the extractor output a DC voltage that is greater in magnitude than the DC control voltage input.

19 Claims, 15 Drawing Sheets

CIRCUIT FOR BOOSTING DC VOLTAGE

RELATED APPLICATIONS

This application relates to and claims priority of U.S. Provisional Application Ser. No.: 60/471,109 filed May 16, 2003.

FIELD OF THE INVENTION

The present invention relates to a circuit for boosting a DC voltage using a radio frequency (RF) input signal, wherein the boost circuit does not significantly load (attenuate) the RF signal path.

RELATED ART

FIG. 1 is a circuit diagram of a conventional art single pole, four throw (SP4T) high-power field effect transistor (FET) RF switch 100. RF switch 100 includes resistors 110-113, 120-123, 130-133, 140-143 and 150-154, capacitors 160-164, RF sources 171-174 and n-channel field effect transistors 114-116, 124-126, 134-136 and 144-146, which are connected as illustrated. Resistors 110-113 and transistors 114-116 form a first switch element 191; resistors 120-123 and transistors 124-126 form a second switch element 192; resistors 130-133 and transistors 134-136 form a third switch element 193; and resistors 140-143 and transistors 144-146 form a fourth switch element 194.

During normal operation, one (or none) of the switch elements 191-194 is enabled. To enable one of the switch elements 191-194, a corresponding DC control voltage $V_{C1}$-$V_{C4}$ is activated, thereby turning on an associated set of switch transistors 114-116, 124-126, 134-125 or 144-146. For example, switch element 191 may be enabled by activating DC control voltage $V_{C1}$. The activated control voltage $V_{C1}$ turns on transistors 114-116 (via resistors 110-113), thereby allowing an RF signal from RF source 171 to be routed through input resistor 151, input capacitor 161, transistors 114-116 and output capacitor 160 to load resistor 150. The input resistor 151 and load resistor 150 are typically matched. For example, input resistor 151 and load resistor 150 may each have a resistance of 50 Ohms. In this example, the DC control voltages $V_{C2}$-$V_{C4}$ are deactivated, such that switch elements 191-194 are disabled.

The activated control voltage (e.g., $V_{C1}$) is typically provided by (or derived from) a system voltage supply. For example, the activated control voltage $V_{C1}$ may have a nominal value of about 2.5 Volts. When the control voltage $V_{C1}$ Is activated, a small DC control current $I_{C1}$ flows through resistor 110 (to resistors 111-113).

It is desirable for RF switch 100 to operate in a linear manner, with a low control current (e.g., $I_{C1}$) However, semiconductor switches, such as RF switch 100, are inherently non-linear. Output harmonics, which add distortion to the RF output signal, are generated as a result of the non-linear behavior of the semiconductor RF switch 100. These output harmonics increase significantly as the control voltage (e.g., $V_{C1}$) decreases. For example, the harmonics may increase significantly if the control voltage $V_{C1}$ drops below 2.5 Volts.

It would therefore be desirable to have an RF switch that is capable of operating in a highly linear manner in response to a low control voltage. It would further be desirable if such an RF switch did not consume excessive layout area on a semiconductor chip. It would further be desirable if such an RF switch did not add significant non-linearity to the RF signal path. It would further be desirable if such an RF switch did not significantly increase the required DC control current. It would further be desirable if such an RF switch did not exhibit a substantially higher insertion loss than RF switch 100.

SUMMARY OF THE INVENTION

Accordingly, the present invention provides a DC voltage boost circuit that provides a boosted DC output voltage in response to an RF input signal. The boosted DC output voltage can be a negative or positive voltage, depending on the configuration of the DC voltage boost circuit. The DC voltage boost circuit includes a capacitor coupled to receive the RF input signal, a high impedance rectifier circuit coupled to the capacitor, and a bias extractor circuit (which provides the boosted DC output voltage) coupled to the high impedance rectifier circuit.

The high impedance rectifier circuit advantageously prevents a high current from being drawn from the source of the RF input signal. As a result, the DC voltage boost circuit adds only a minimal insertion loss to the RF input signal.

In one embodiment, a DC control voltage is applied to the rectifier circuit, whereby the DC voltage boost circuit effectively boosts the DC control voltage to create the boosted DC output voltage. In one embodiment, the boosted DC output voltage is equal to the DC control voltage, plus about 2 Volts.

The boosted DC output voltage can be used, for example, to control an RF switch element. In this embodiment, the RF input signal is routed through the RF switch element. The relatively high boosted DC output voltage is used to turn on the RF switch element, thereby minimizing output harmonics in the RF output signal routed from the RF switch element.

The present invention will be more fully understood in view of the following description and drawings.

DETAILED DESCRIPTION

Figure 1:
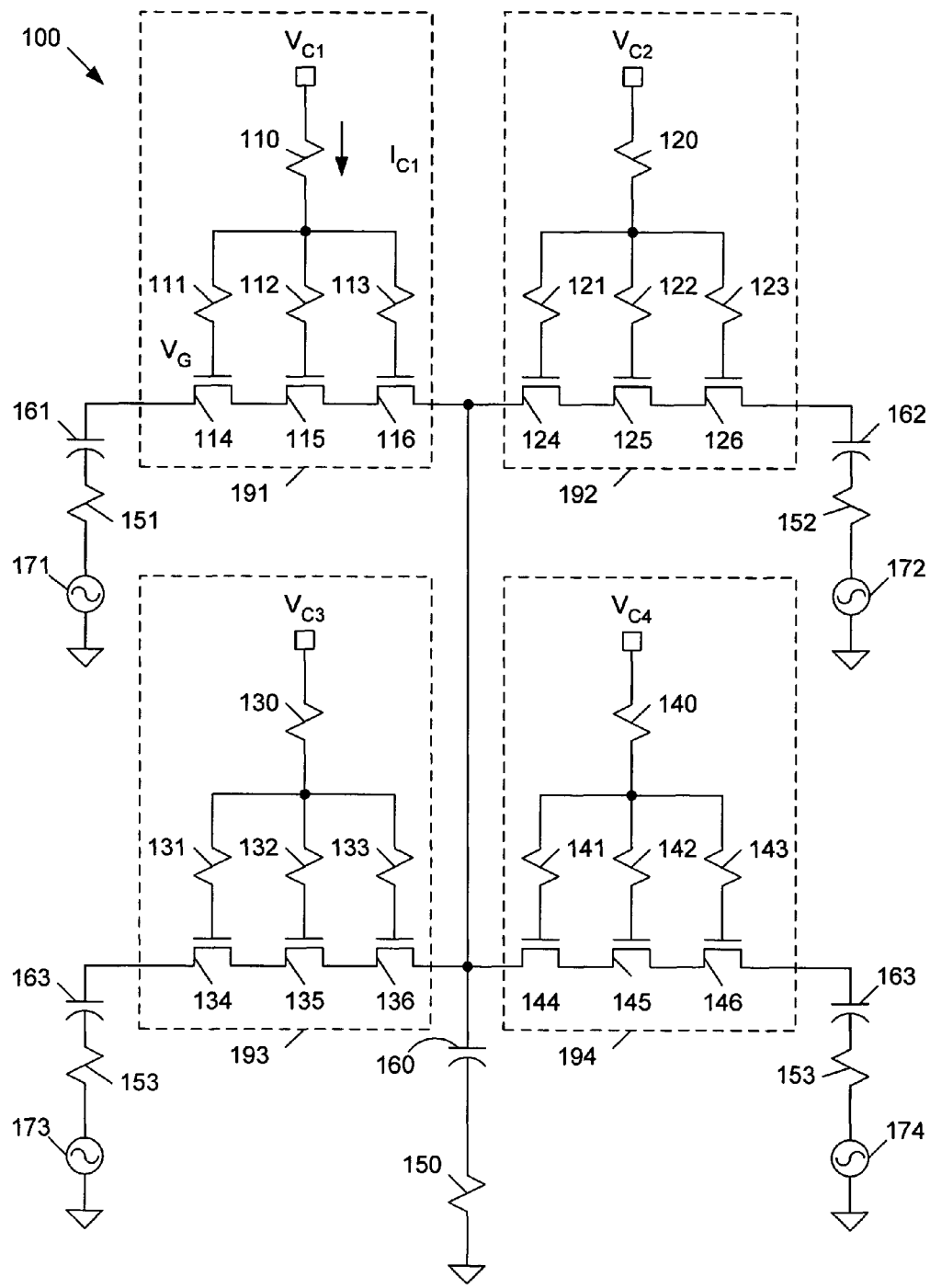
FIG. 1 is a circuit diagram of a conventional SP4T high-power FET RF switch.
Figure 2:
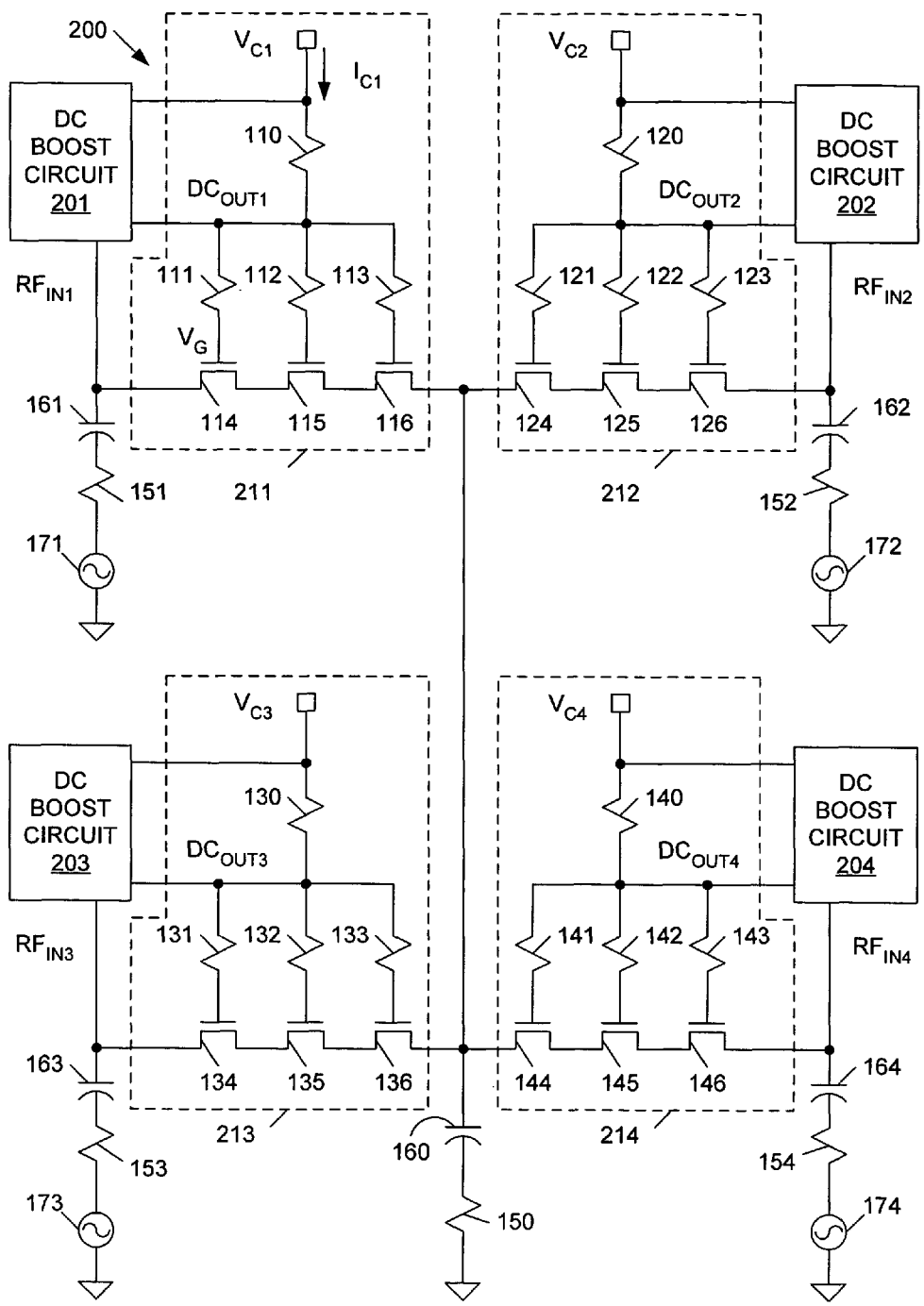
FIG. 2 is a circuit diagram of a SP4T high-power FET RF switch that includes four boost circuits in accordance with one embodiment of the present invention.

FIG. 2 is a circuit diagram of a single pole, four throw (SP4T) high-power FET RF switch 200, which includes boost circuits 201-204 in accordance with one embodiment of the present invention. Although the present embodiment includes boost circuits used in connection with a SP4T switch, one of ordinary skill in the art would understand how to use the boost circuit of the present invention in other switch configurations. Because RF switch 200 is similar to RF switch 100 (FIG. 1), similar elements in FIGS. 1 and 2 are labeled with similar reference numbers. In addition to resistors 110-113, 120-123, 130-133, 140-143 and 150-154, n-channel FETs 114-116, 124-126, 134-136 and 144-146, capacitors 160-164, RF sources 171-174, RF switch 200 includes DC boost circuits 201-204. Because DC boost circuits 201-204 modify the operation of switch elements 191-194, these switch elements are relabeled as switch elements 211-214 in FIG. 2.

Each of DC boost circuits 201-204 is configured to receive a corresponding DC control voltage $V_{C1}$-$V_{C4}$, respectively, and a corresponding RF input signal $RF_{IN1}$-$RF_{IN4}$, respectively. In response, each of DC boost circuits 201-204 provides a boosted DC output voltage $DC_{OUT1}$-$DC_{OUT4}$, respectively. These boosted DC output voltages $DC_{OUT1}$-$DC_{OUT4}$, are provided to the gates of switch transistors 114-116, 124-126, 134-136 and 144-146, respectively. Although three switch transistors (and three associated resistors) are present in each of switch elements 211-214 in the described embodiment, it is understood that other numbers of switch transistors (and associated resistors) can be used in other embodiments. Moreover, although the boosted DC output voltages $DC_{OUT1}$-$DC_{OUT4}$ are used to drive switch elements 211-214, respectively, in the described embodiment, it is understood that such DC boost circuits 201-204 can also be used to generate DC output voltages $DC_{OUT1}$-$DC_{OUT4}$ for other purposes in other applications.

At most, one of the switch elements 211-214 is activated at any given time. Consequently, the present embodiment will be described in more detail with respect to switch element 211 and the associated DC boost circuit 201. However, it is understood that switch elements 212-214 and the associated DC boost circuits 202-204 operate in the same manner.

Figure 3:
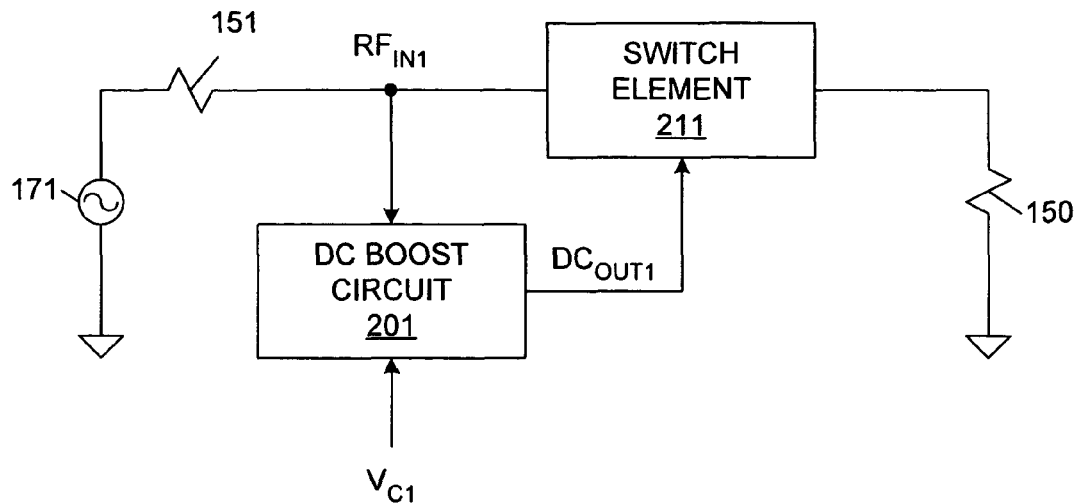
FIG. 3 is a block diagram that illustrates a portion of the RF switch of FIG. 2 in accordance with one embodiment of the present invention.

FIG. 3 is a block diagram that illustrates resistors 150-151, RF source 171, DC boost circuit 201 and switch element 211. Capacitors 160-161 are not shown in FIG. 3 for purposes of clarity. DC boost circuit 201 is coupled in a shunt configuration with a radio frequency signal path comprising RF input signal source 171 and resistors 150-151. As described in more detail below, DC boost circuit 201 can be used to boost the voltage associated with an existing DC voltage source (which provides DC control voltage $V_{C1}$) to a higher (or lower) value, without significantly increasing the current ($I_{C1}$) supplied by the DC voltage source.

Figure 4:
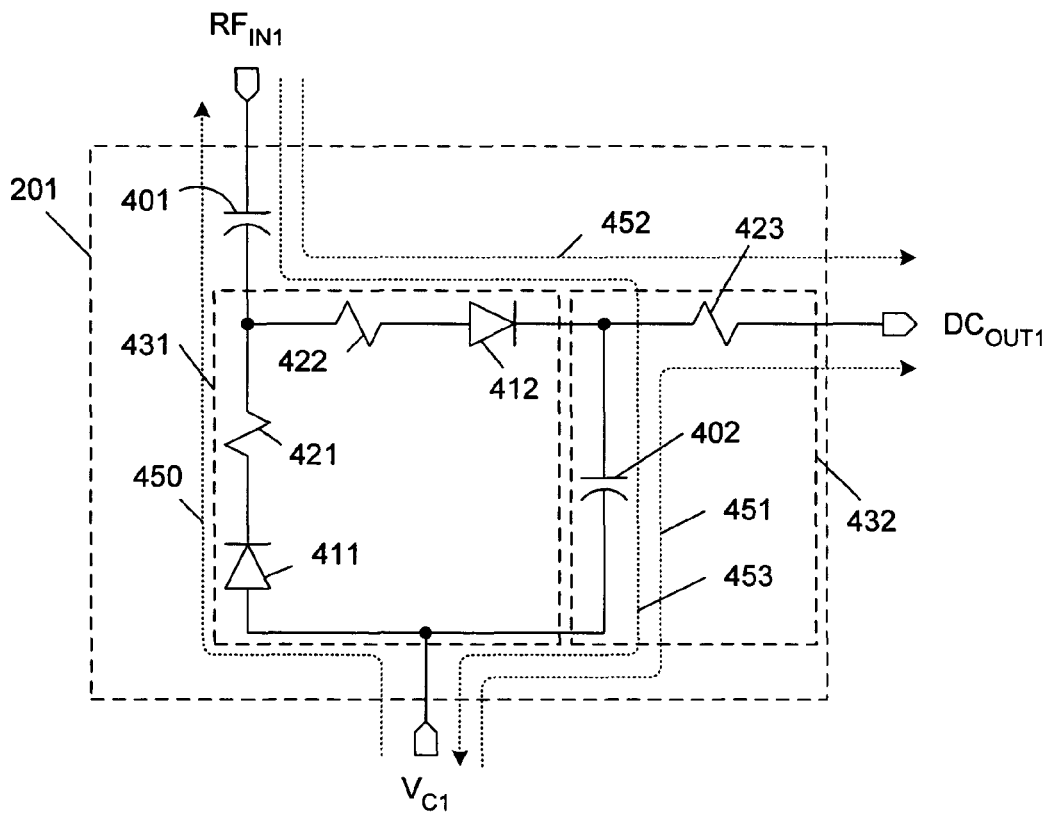
FIG. 4 is a circuit diagram of DC boost circuit in accordance with one embodiment of the present invention.

FIG. 4 is a circuit diagram of DC boost circuit 201 in accordance with one embodiment of the present invention. DC boost circuit 201 includes capacitors 401-402, diode elements 411-412 and resistors 421-423, which are connected as illustrated. Diode elements 411-412 and resistors 421-422 are configured to form a rectifier circuit 431. Capacitor 402 and resistor 423 are configured to form a bias extractor circuit 432. In general, DC boost circuit 201 operates as follows in response to a positive DC input voltage $V_{C1}$. The $RF_{IN1}$ signal oscillates between negative voltages and positive voltages. When the $RF_{IN1}$ signal has a sufficiently low/negative voltage, diode element 411 turns on and capacitor 401 charges in the direction illustrated by dashed line 450. At this time, diode element 412 is turned off, and the $DC_{OUT1}$ voltage is supplied by capacitor 402, as illustrated by dashed line 451.

When the $RF_{IN1}$ signal has a sufficiently high/positive voltage, diode element 412 turns on, and capacitor 401 discharges to provide the $DC_{OUT1}$ voltage, in the direction illustrated by dashed line 452. At this time, diode element 411 is turned off, and capacitor 402 charges in the direction illustrated by dashed line 453.

As described above, diode elements 411 and 412 operate as a rectifier circuit. Resistors 421 and 422 present a high impedance to RF source 171 (i.e., provide a high input impedance for the rectifier circuit). As a result, resistors 421 and 422 advantageously prevent DC boost circuit 201 from drawing a high current from RF source 171. Capacitor 402 (and resistor 423) operate as a bias extractor, which provides the boosted DC output voltage $DC_{OUT1}$ to switch element 191 in response to the charge pumped through the rectifier circuit. DC boost circuit 201 advantageously provides a high AC impedance at the $DC_{OUT1}$ output terminal.

As described in more detail below, boost circuit 201 is used to overcome the deleterious effect of a low DC control voltage (e.g., $V_{C1}$) on the harmonic performance of a high-power FET RF switch. To accomplish this, boost circuit 201 uses a portion of the RF input signal (e.g., $RF_{FN1}$) to increase the effective switch control voltage. (e.g., the voltage on the gates of switch transistors 114-116).

In the forgoing manner, DC boost circuit 201 provides the $DC_{OUT1}$ voltage in response to the $RF_{IN1}$ signal and the $V_{C1}$ control voltage. In a particular embodiment, capacitor 401 has a capacitance of 0.4 picoFarads (pF) and capacitor 402 has a capacitance of 0.8 pF. In this embodiment, each of diode elements 411 and 412 are made of an n-channel field effect transistor having commonly coupled source and drain regions. The channel region of each transistor has a width of about 10 microns. The gate of the transistor forms the anode of the diode element, and the commonly coupled source and drain regions form the cathode of the diode element. Although each of diode elements 411 and 412 is made of a single diode in the described embodiment, it is understood that in other embodiments, each of diode elements 411 and 412 can be made of a plurality of diodes. These diodes can be connected, for example, in series. Resistors 421 and 422 each have a resistance of about 15 kilo-Ohms (kΩ), and resistor 423 has a resistance of about 10 kΩ. In this embodiment, boost circuit 201 can easily generate 5-6 Volts of DC voltage boost (positive or negative) from a 1-2 Watt RF input signal, $RF_{IN1}$.

Figure 5:
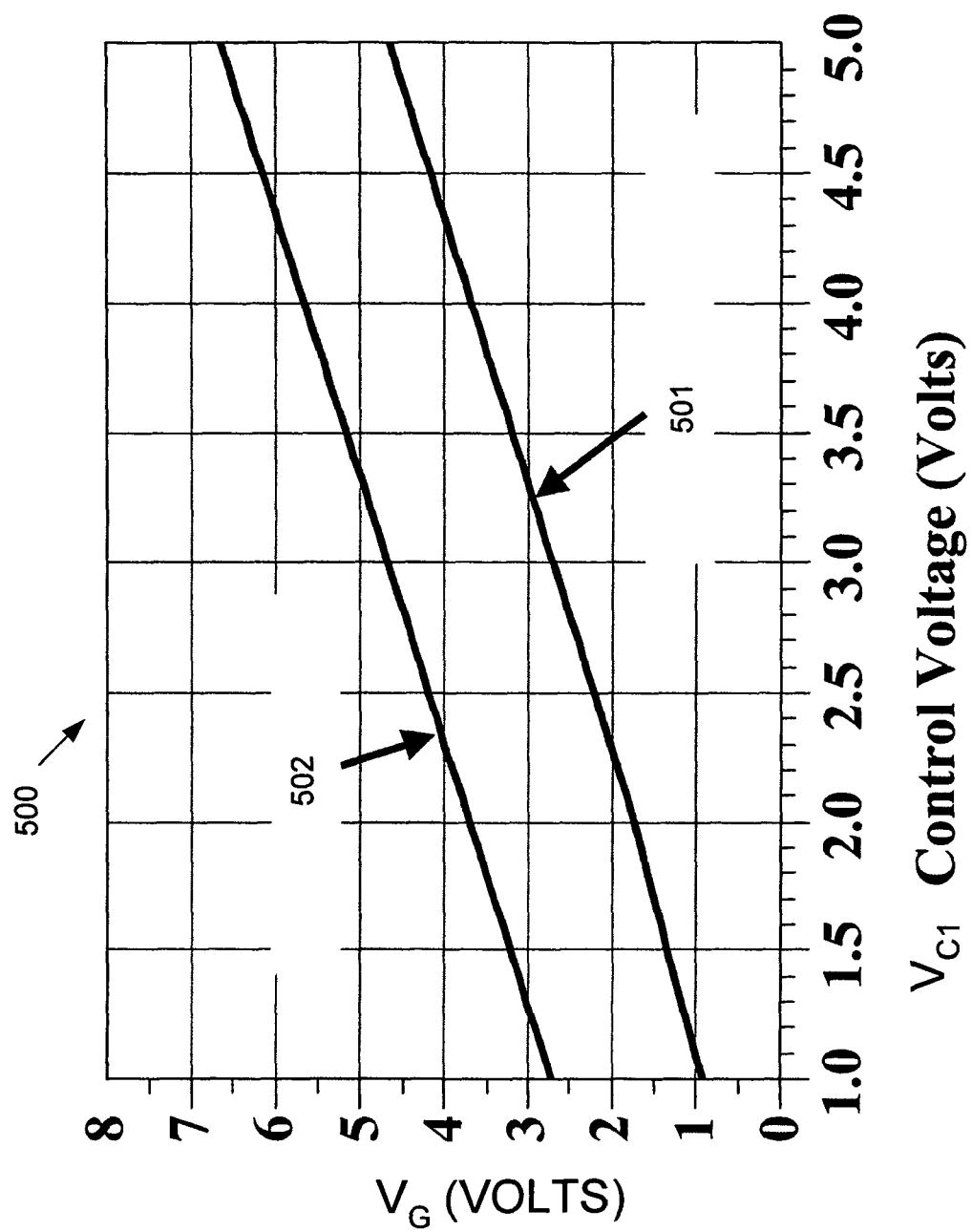
FIG. 5 is a graph that illustrates the DC voltage ($V_G$) applied to the gates of transistors in an RF switch without a DC boost circuit, and the DC voltage ($V_G$) applied to the gates of transistors in RF switch with a DC boost circuit, with respect to a DC control voltage $V_{C1}$.

FIG. 5 is a graph 500 that illustrates the DC voltage ($V_G$) applied to the gates of transistors 114-116 in RF switch 100 (without a DC boost circuit), and the DC voltage ($V_G$) applied to the gates of transistors 114-116 in RF switch 200 (with DC boost circuit 201), with respect to the DC control voltage $V_{C1}$. This graph 500 assumes that the RF input signal $RF_{IN1}$ has a frequency of 1 GHz and an input power of 34 dBm. The DC gate voltage $V_G$ of RF switch 100 is illustrated as line 501, and the DC gate voltage $V_G$ of RF switch 200 is illustrated as line 502. For RF switch 100, the DC gate voltage $V_G$ applied to the gates of transistors 114-116 is always slightly less than the control voltage $V_{C1}$. However, for RF switch 200, the DC gate voltage $V_G$ applied to the gates of transistors 114-116 is about 2 Volts greater than the control voltage $V_{C1}$. As described in more detail below, this high gate voltage $V_G$ advantageously improves the linearity of RF switch 200 by minimizing output harmonics.

Figure 6:
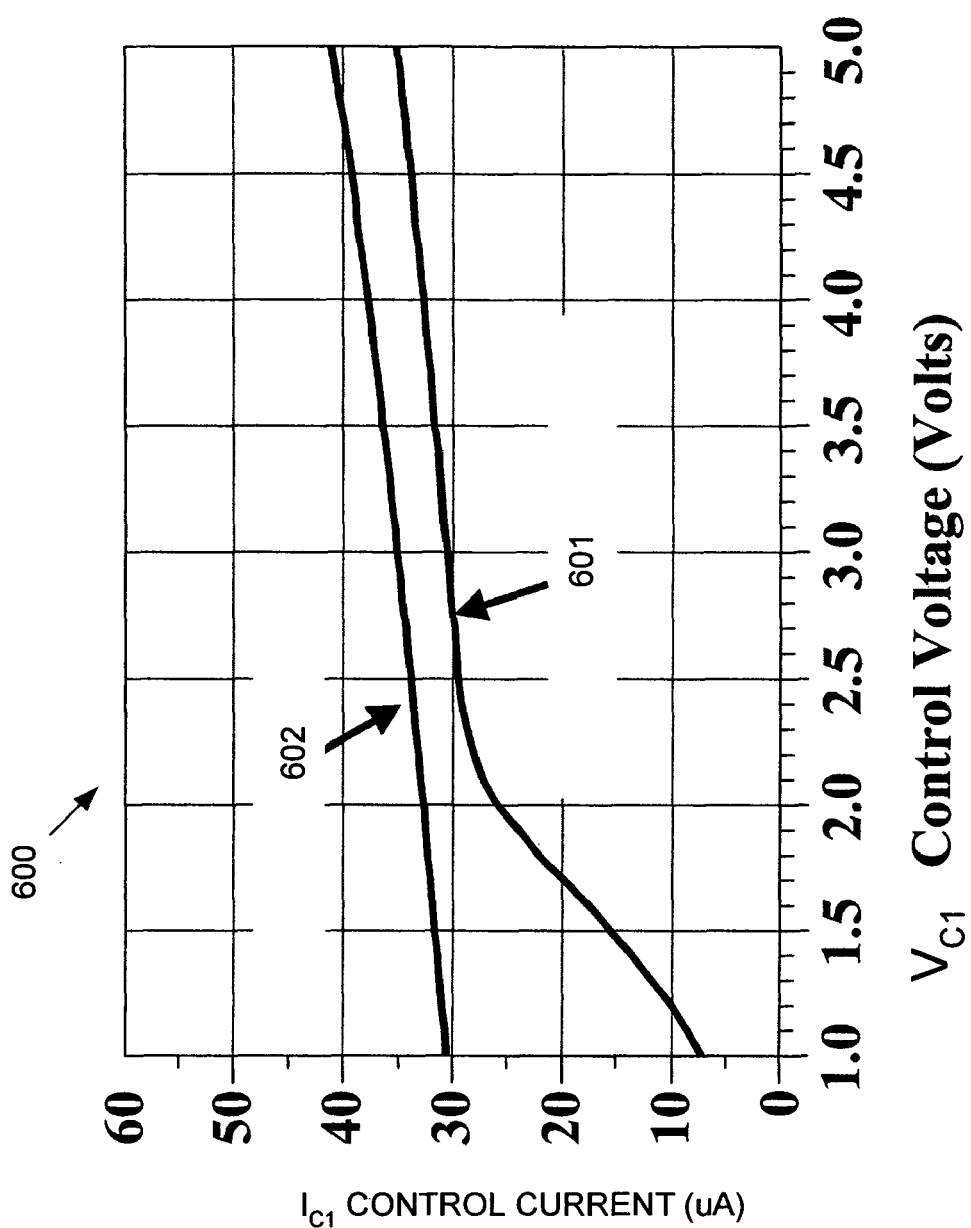
FIG. 6 is a graph that illustrates the DC control current ($I_{C1}$) drawn from the DC voltage supply in an RF switch without a boost circuit and an RF switch with a boost circuit, with respect to a DC control voltage $V_{C1}$.

FIG. 6 is a graph 600 that illustrates the DC control current ($I_{C1}$) drawn from the DC voltage supply in RF switch 100 and RF switch 200, with respect to the DC control voltage $V_{C1}$. Like graph 500, graph 600 also assumes that the $RF_{IN1}$ signal has a frequency of 1 GHz and an input power of 34 dBm. The DC control current $I_{C1}$ drawn from the DC voltage supply in RF switch 100 is illustrated as line 601, and the DC control current $I_{C1}$ drawn from the DC voltage supply in RF switch 200 is illustrated as line 602. At voltages greater than about 2.5 Volts, the DC control current $I_{C1}$ drawn from the DC voltage supply in RF switch 200 is only slightly greater than the DC control current $I_{C1}$ drawn from the DC voltage supply in RF switch 100. More specifically, the DC control current $I_{C1}$ drawn from the DC voltage supply in RF switch 200 is only about 5 to 6 micro-Amps (µA) greater than the DC control current $I_{C1}$ drawn from the DC voltage supply in RF switch 100 for control voltages $V_{C1}$ greater than 2.5 Volts. Advantageously, DC boost circuit 201 does not require an excessive amount of additional current from the DC voltage supply.

Figure 7:
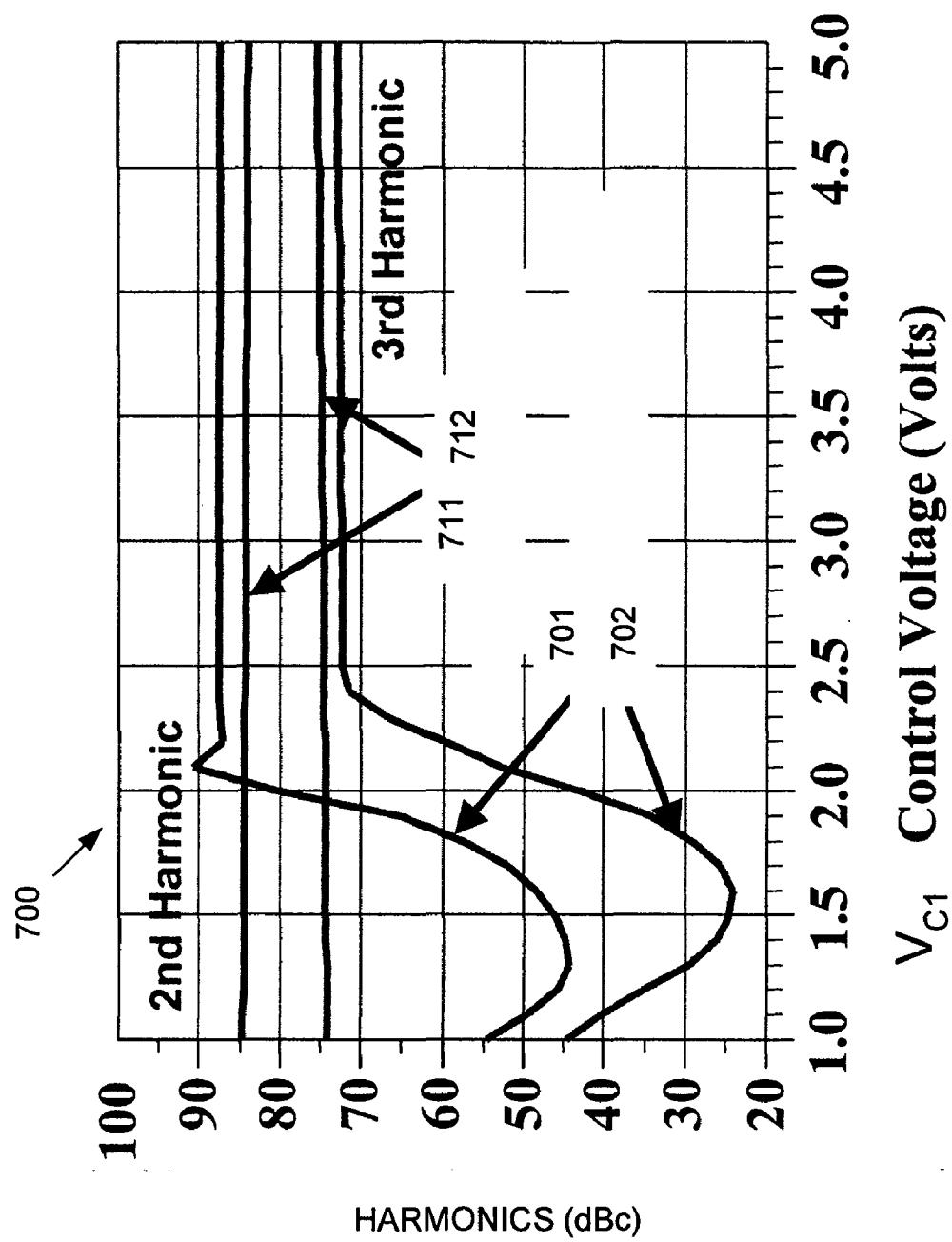
FIG. 7 is a graph that illustrates the second and third output harmonics for an RF switch without a boost circuit and an RF switch with a boost circuit, with respect to a control voltage $V_{C1}$.

FIG. 7 is a graph 700 that illustrates the second and third output harmonics for RF switch 100 and RF switch 200, with respect to the control voltage $V_{C1}$. Like graphs 500 and 600, graph 700 also assumes that the $RF_{IN1}$ signal has a frequency of 1 GHz and an input power of 34 dBm. The second and third output harmonics of RF switch 100 are illustrated as lines 701-702, respectively. The second and third output harmonics of RF switch 200 are illustrated as lines 711-712, respectively. The output harmonics are measured in decibels down from the carrier signal, or dBc. A higher dBc value represents smaller harmonics, and therefore a more linear transfer function within the RF switch. For a control voltage $V_{C1}$ less than about 2.5 Volts, the third harmonics of RF circuit 100 are significantly lower than the third harmonics of RF circuit 200. Similarly, for a control voltage $V_{C1}$ less than about 2 Volts, the second harmonics of RF circuit 100 are significantly lower than the second harmonics of RF circuit 200. Thus, for a control voltage $V_{C1}$ less than about 2.5 Volts, RF switch 200 advantageously operates in a significantly more linear manner than RF switch 100.

Figure 8:
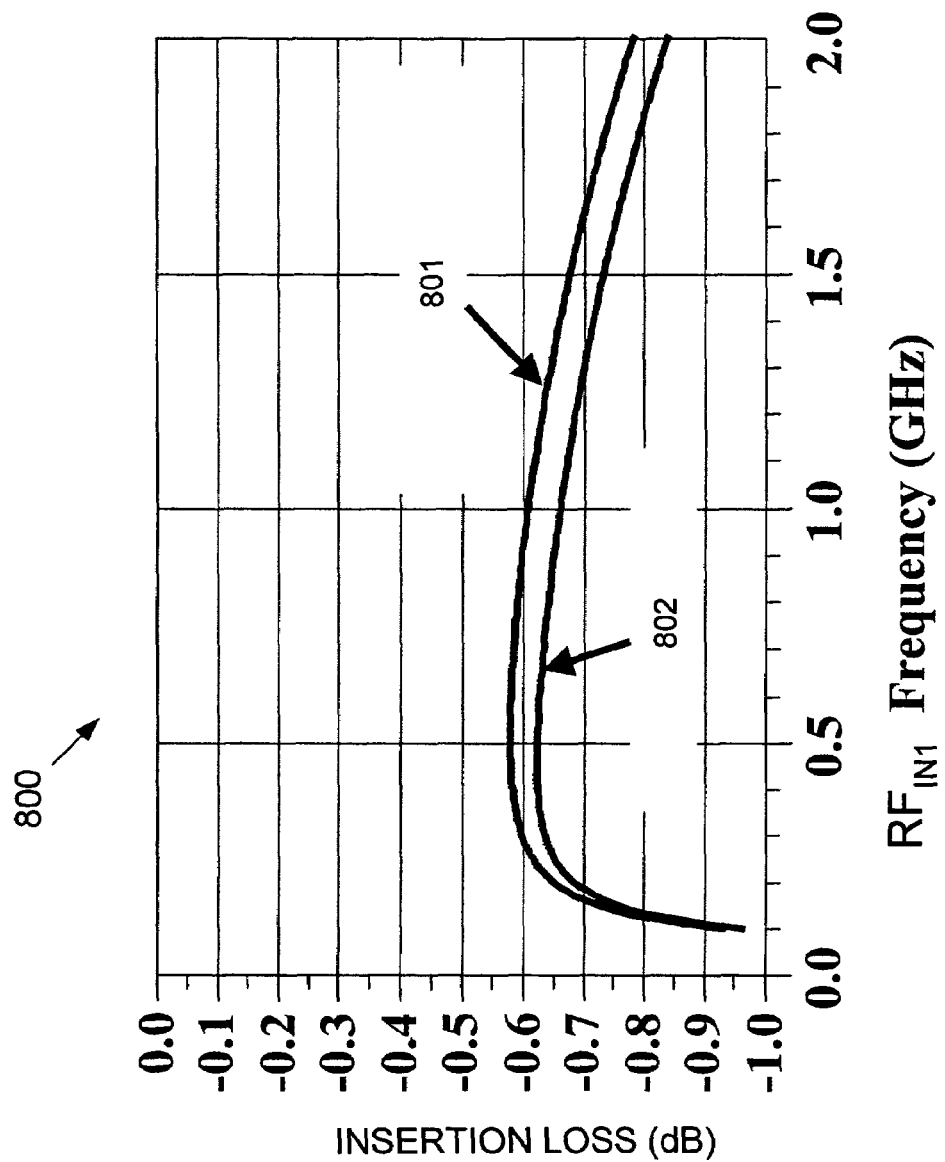
FIG. 8 is a graph that compares the insertion loss of an RF switch without a boost circuit and an RF switch with a boost circuit, with respect to frequency of an RF input signal $R_{FIN1}$.

FIG. 8 is a graph 800 that compares the insertion loss of RF switch 100 with the insertion loss of RF switch 200, with respect to frequency of the RF input signal $R_{FIN1}$. In general, insertion loss is a measure of output power with respect to input power. The insertion loss of RF switch 100 is illustrated as line 801, and the insertion loss of RF switch 200 is illustrated as line 802. As illustrated, there is very little insertion loss associated with the addition of DC boost circuit 201. For example, at a frequency of 1 giga-Hertz (GHz), DC boost circuit 201 only adds about 0.05 dB of insertion loss (or about 8% insertion loss). In general, boost circuit 201 provides an RF signal path attenuation of only about 0.04-0.05 dB.

Figure 9:
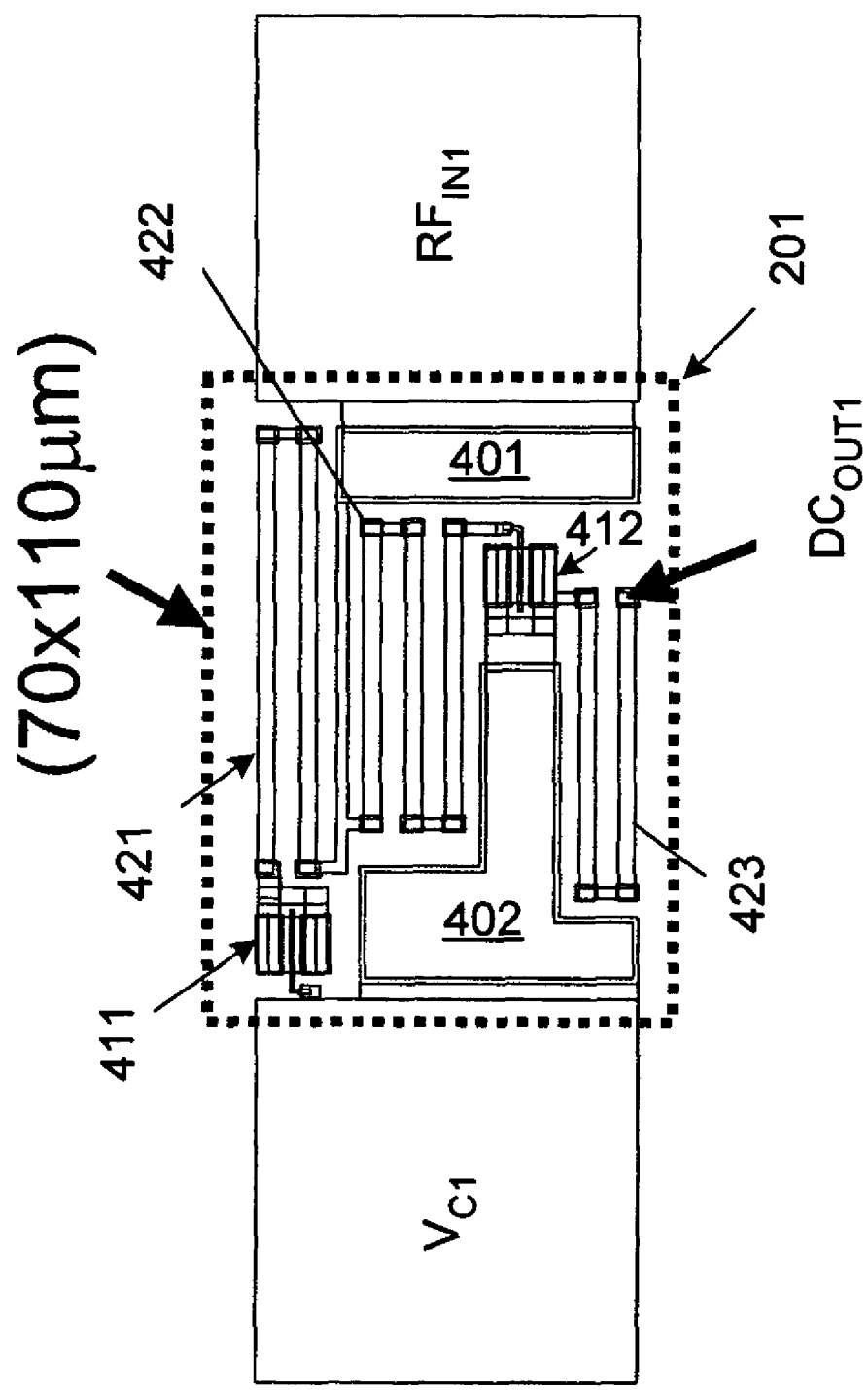
FIG. 9 is a layout diagram illustrating the DC boost circuit of FIG. 4 in accordance with one embodiment of the present invention.

FIG. 9 is a layout diagram illustrating DC boost circuit 201 in accordance with one embodiment of the present invention. This layout diagram illustrates diode elements 411-412, which are diode-connected FETs (as described above); resistors 421-423, which can be epitaxial, bulk, high resistivity metal (e.g., nichrome, tungsten silicide, tungsten nitride) or polysilicon traces; and capacitors 401-402, which are formed by a semiconductor substrate, a first metal layer formed over the semiconductor substrate, a dielectric layer formed over the first metal layer, and a second metal layer (e.g., gold) formed over the dielectric layer. Advantageously, DC boost circuit 201 can be implemented using standard semiconductor fabrication techniques in a relatively small area. For example, DC boost circuit 201 can have an area of about 70×110 microns$^2$ using a conventional 0.5 micron gallium arsenide pseudomorphic high electron mobility transistor (PHEMT) process. Consequently, DC boost circuit 201 is ideal for low cost applications. Other acceptable processes for fabricating DC boost circuit 201 include a CMOS process, a silicon-on-insulator (SOI) process, or any ion implanted MESFET process.

DC boost circuit 201 can be modified in accordance with other embodiments of the present invention. FIGS. 10-22 are circuit diagrams illustrating variations of DC boost circuit 201 in accordance with various embodiments of the present invention. Because the DC boost circuits of FIGS. 10-22 are similar to DC boost circuit 201 (FIG. 4), similar elements in FIGS. 4 and 10-22 are labeled with similar reference numbers.

Figure 10:
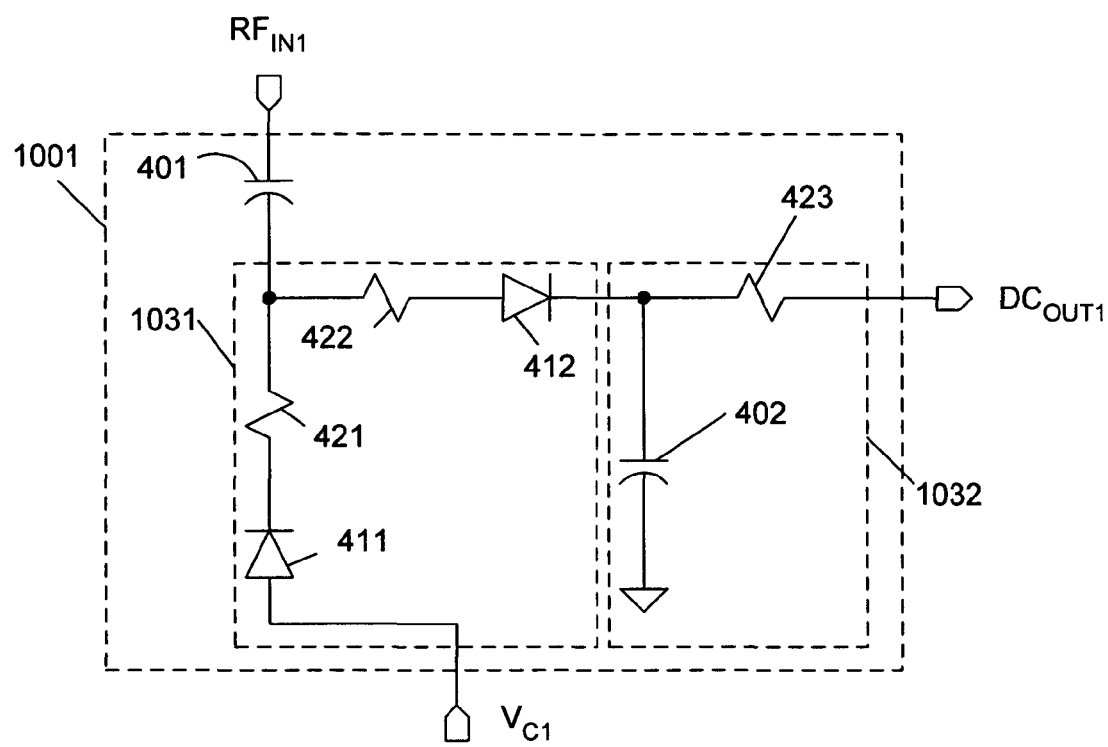
FIGS. 10-22 are circuit diagrams illustrating variations of the DC boost circuit of FIG. 4, in accordance with different embodiments of the present invention.

FIG. 10 is a circuit diagram of DC boost circuit 1001, in accordance with one embodiment of the present invention. DC boost circuit 1001 is similar to DC boost circuit 201. However, capacitor 402 is coupled to receive the ground supply voltage, rather than the $V_{C1}$ voltage. The connection of capacitor 402 to the ground voltage supply makes this configuration slightly more complex. This configuration results in rectifier circuit 1031 and bias extractor 1032.

Figure 11:
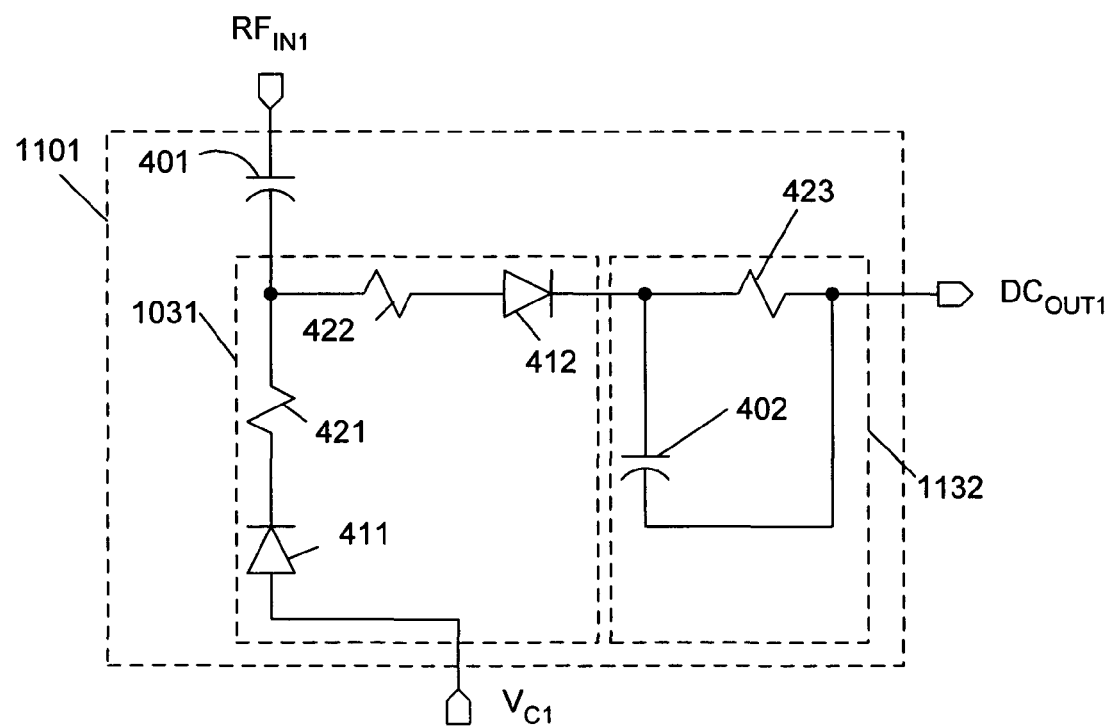

FIG. 11 is a circuit diagram of DC boost circuit 1101, in accordance with another embodiment of the present invention. DC boost circuit 1101 is similar to DC boost circuit 1001. However, capacitor 402 is coupled to the output terminal of the DC boost circuit, rather than the ground voltage supply. This configuration results in bias extractor circuit 1132.

Figure 12:
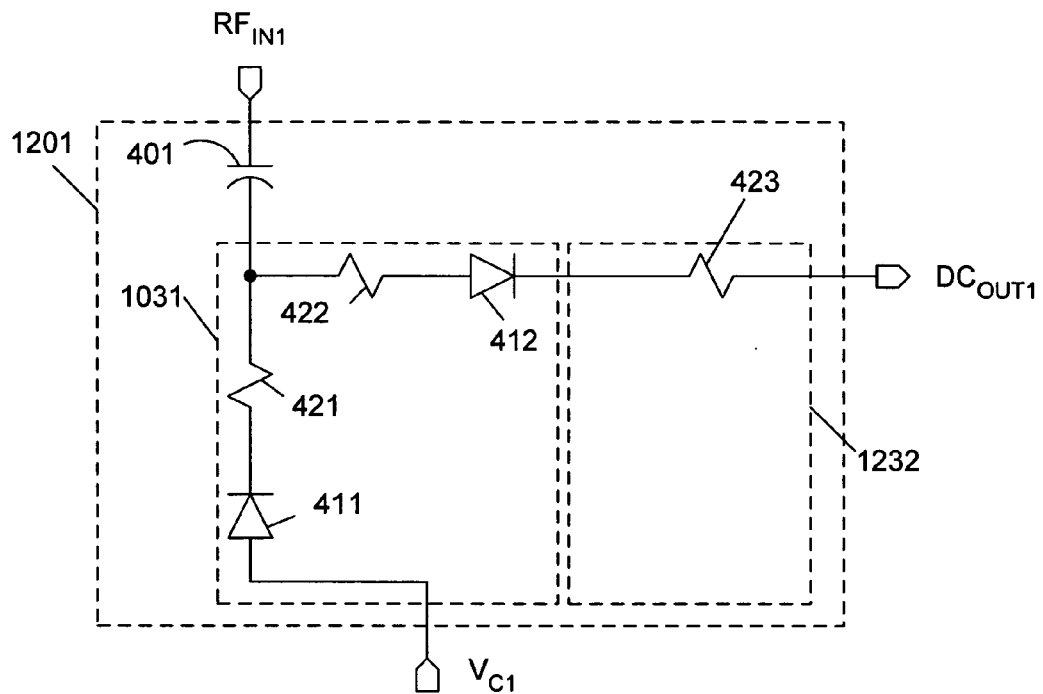

FIG. 12 is a circuit diagram of DC boost circuit 1201, in accordance with another embodiment of the present invention. DC boost circuit 1201 is similar to DC boost circuit 1001. However, capacitor 402 is eliminated from DC boost circuit 1201. In this embodiment, the capacitance of the load (e.g., the gate capacitances of transistors 114-116) is used to replace capacitor 402. This configuration results in bias extractor circuit 1232.

Figure 13:
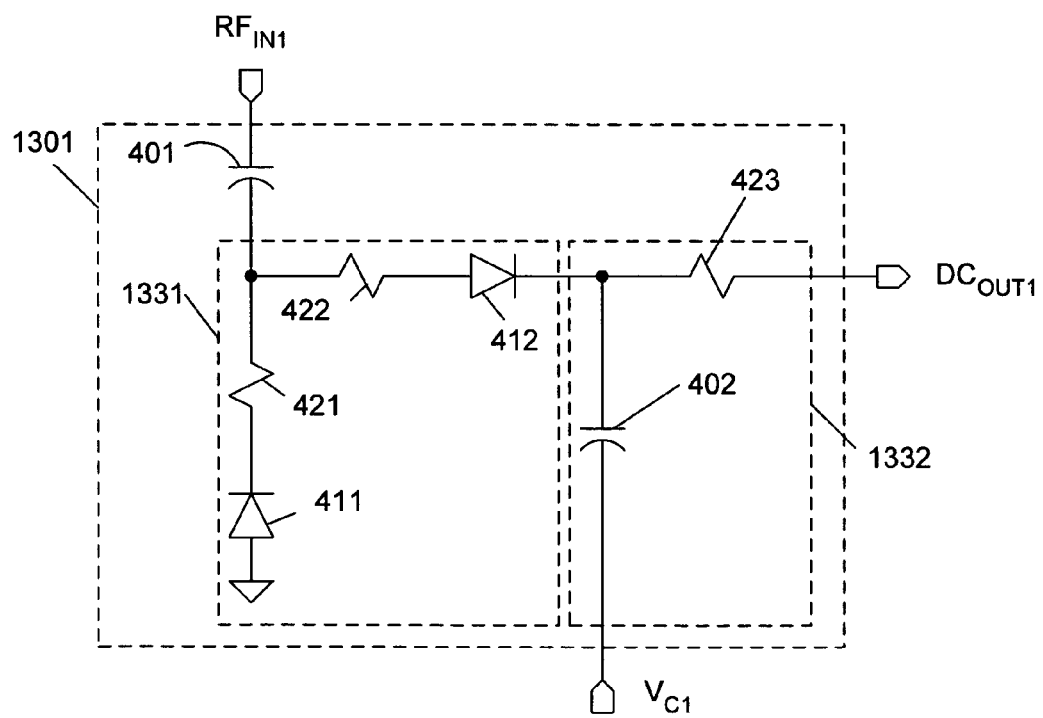

FIG. 13 is a circuit diagram of DC boost circuit 1301, in accordance with another embodiment of the present invention. DC boost circuit 1301 is similar to DC boost circuit 201. However, the anode of diode element 441 is coupled to receive the ground supply voltage, rather than the $V_{C1}$ voltage. The connection of diode element 411 to the ground voltage supply makes this configuration slightly more complex. This configuration results in rectifier circuit 1331 and bias extractor 1332.

Figure 14:
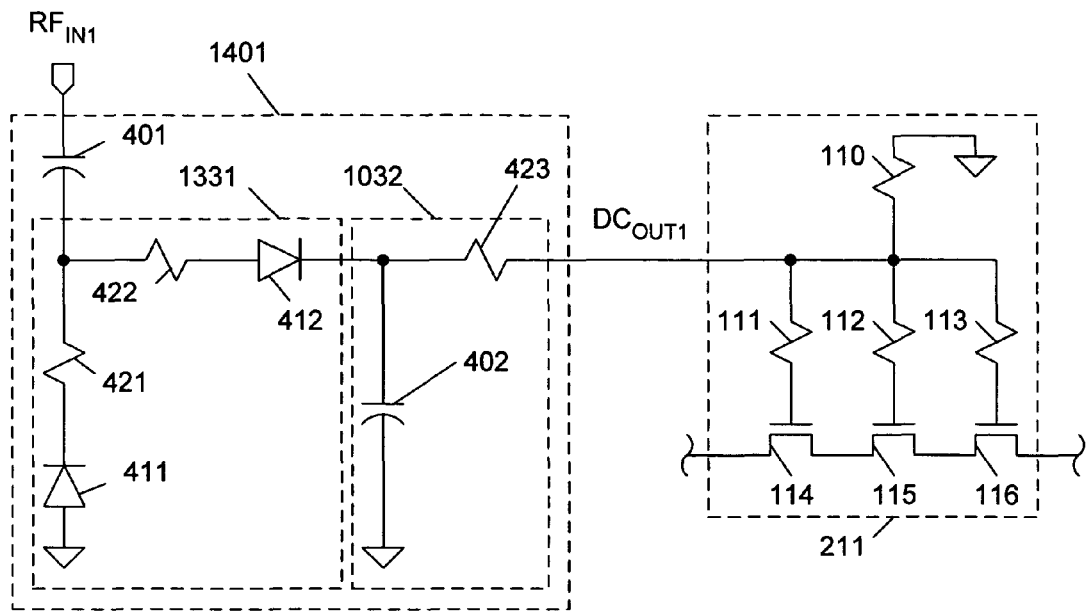

FIG. 14 is a circuit diagram of DC boost circuit 1401, which is coupled to switch element 211 in accordance with another embodiment of the present invention. DC boost circuit 1401 is similar to DC boost circuit 1301. However, capacitor 402 is coupled to receive the ground supply voltage, rather than the $V_{C1}$ voltage. Thus, DC boost circuit 1401 implements rectifier circuit 1331 and bias extractor 1032. Advantageously, DC boost circuit 1401 does not require a DC control voltage $V_{C1}$. The DC control voltage $V_{C1}$ is also eliminated from switch element 211 by coupling resistor 111 to ground, as illustrated. As a result, the control line associated with providing such a control voltage can be advantageously eliminated from an associated printed circuit board or module. DC boost circuit 1401 is especially useful in switches that operate at a relatively constant power, such as those used in wireless local area network (LAN) transmitters.

Figure 15:
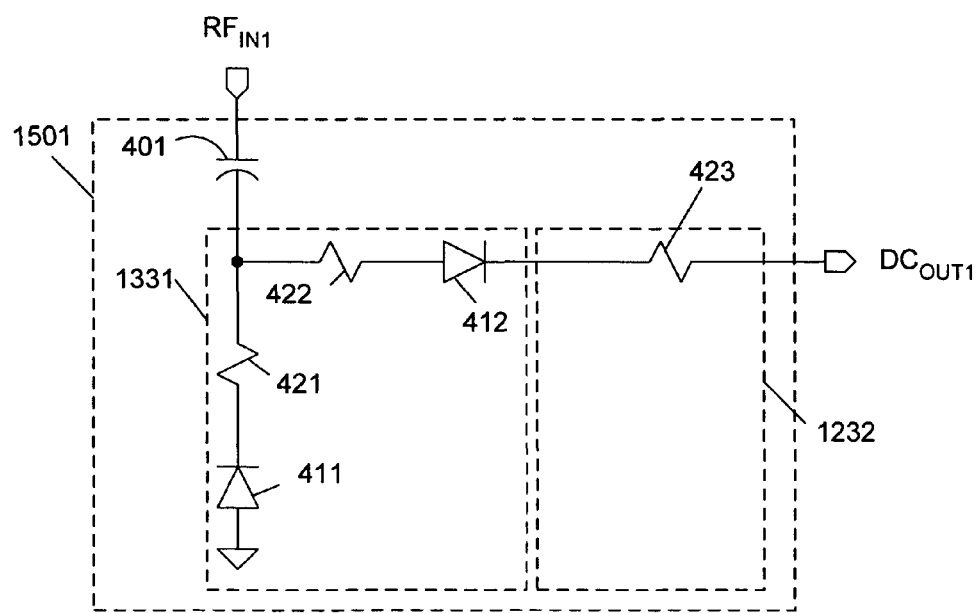

FIG. 15 is a circuit diagram of DC boost circuit 1501, in accordance with another embodiment of the present invention. DC boost circuit 1501 is similar to DC boost circuit 1401. However, capacitor 402 is eliminated from DC boost circuit 1501. In this embodiment, the capacitance of the load (e.g., the gate capacitances of transistors 114-116) is used to replace capacitor 402. Advantageously, DC boost circuit 1501 does not require a DC control voltage $V_{C1}$.

Figure 16:
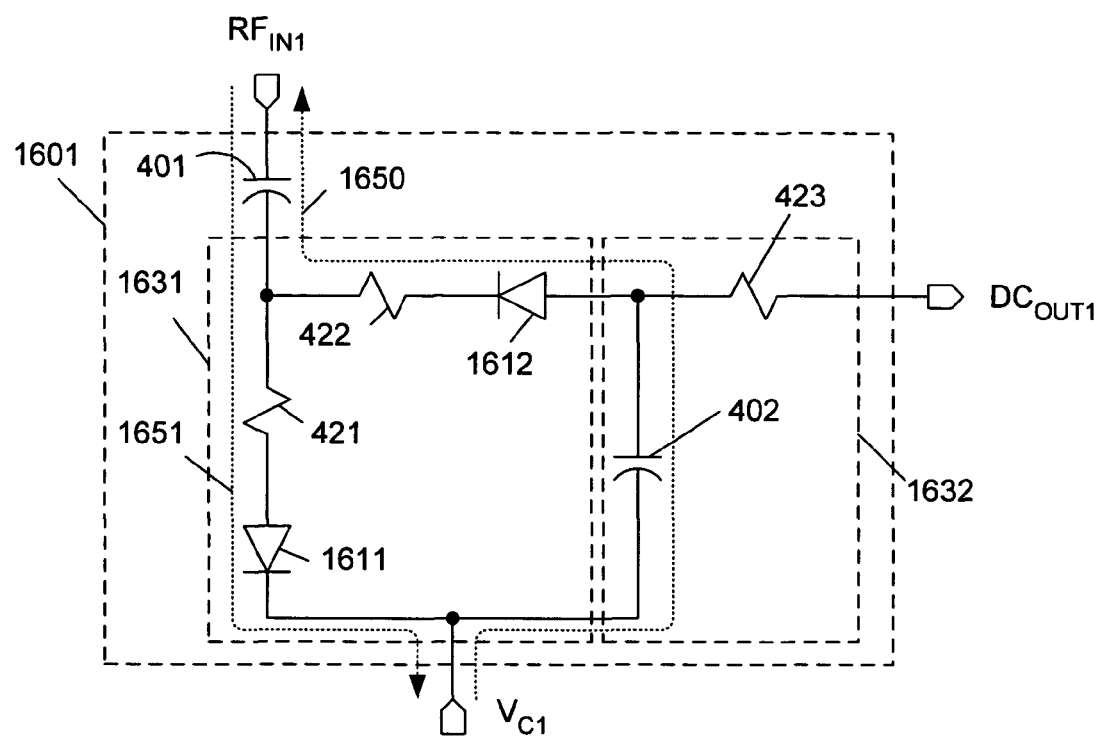

FIG. 16 is a circuit diagram of DC boost circuit 1601, in accordance with one embodiment of the present invention. DC boost circuit 1601 is similar to DC boost circuit 201. However, the connections of diode elements 411 and 412 are reversed, thereby providing diode elements 1611 and 1612.

When the $RF_{IN1}$ signal has a sufficiently low/negative voltage, diode element 1612 turns on and capacitor 401 charges in the direction illustrated by dashed line 1650. At this time, diode element 1611 is turned off, and the $DC_{OUT1}$ voltage is supplied by capacitor 402.

When the $RF_{IN1}$ signal has a sufficiently high/positive voltage, diode element 1611 turns on, and capacitor 401 discharges to the $V_{C1}$ supply terminal, in the direction illustrated by dashed line 1651. At this time, diode element 1612 is turned off. This configuration ensures that the "boosted" output voltage $DC_{OUT1}$ is less than the DC control voltage $V_{C1}$. Thus, if DC control voltage $V_{C1}$ is a negative voltage, then $DC_{OUT1}$ will be a more negative voltage (or "boosted" negative voltage). Thus, DC boost circuit 1601 may be referred to as a negative DC boost circuit.

Figure 17:
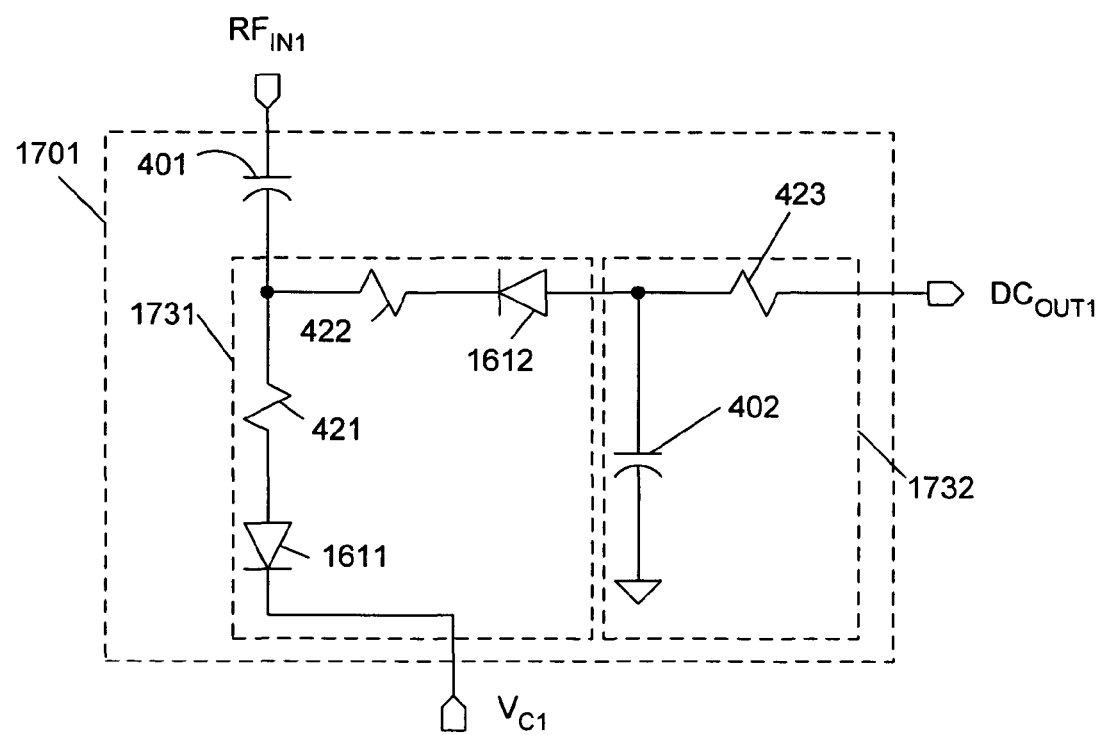

FIG. 17 is a circuit diagram of DC boost circuit 1701, in accordance with one embodiment of the present invention. DC boost circuit 1701 is similar to DC boost circuit 1601. However, capacitor 402 is coupled to receive the ground supply voltage, rather than the $V_{C1}$ voltage. The connection of capacitor 402 to the ground voltage supply makes this configuration slightly more complex. This configuration results in rectifier circuit 1731 and bias extractor 1732.

Figure 18:
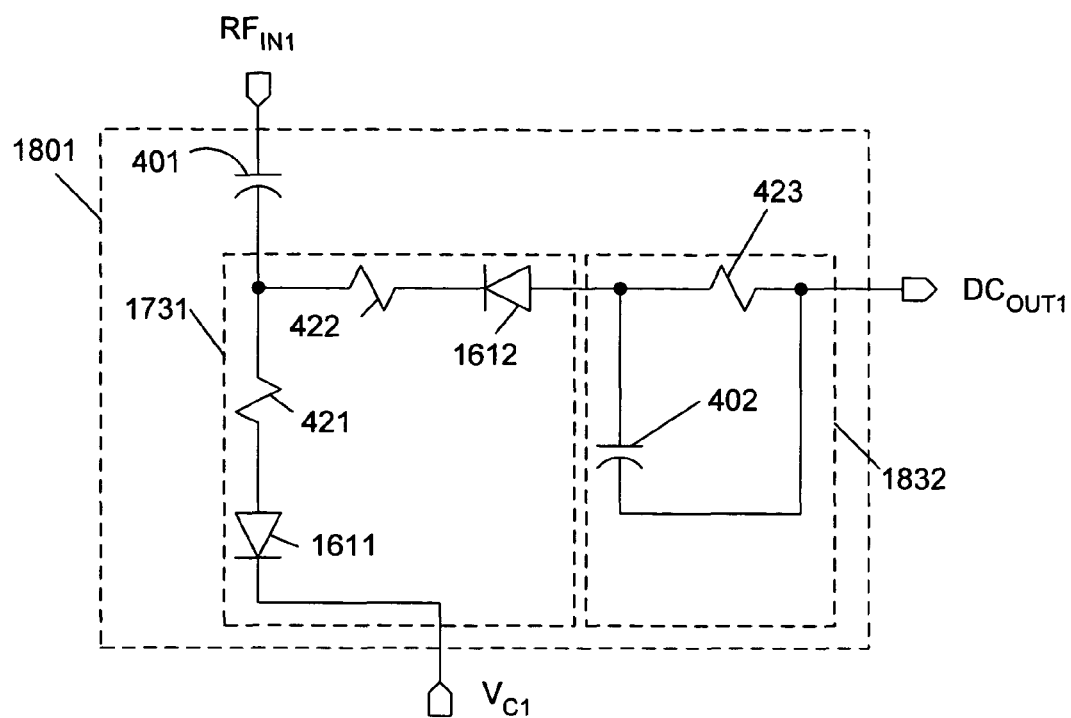

FIG. 18 is a circuit diagram of DC boost circuit 1801, in accordance with another embodiment of the present invention. DC boost circuit 1801 is similar to DC boost circuit 1701. However, capacitor 402 is coupled to the output terminal of the DC boost circuit, rather than the ground voltage supply. This configuration results in bias extractor circuit 1832.

Figure 19:
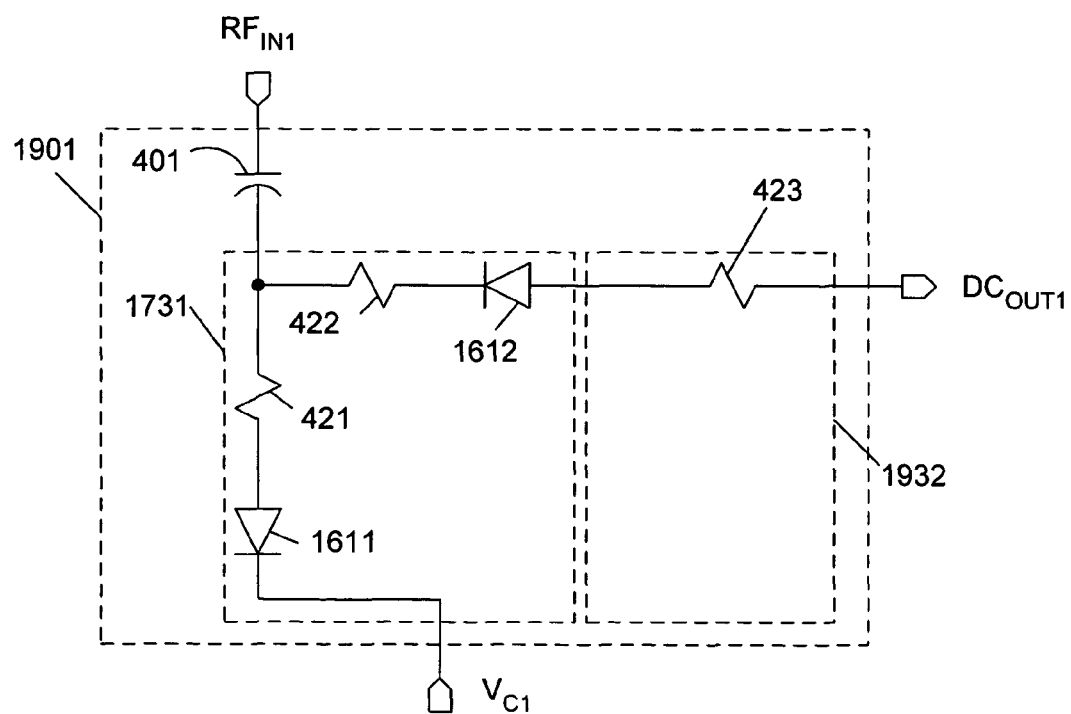

FIG. 19 is a circuit diagram of DC boost circuit 1901, in accordance with another embodiment of the present invention. DC boost circuit 1901 is similar to DC boost circuit 1601. However, capacitor 402 is eliminated from DC boost circuit 1901. In this embodiment, the capacitance of the load (e.g., the gate capacitances of transistors 114-116) is used to replace capacitor 402. This configuration results in bias extractor circuit 1932.

Figure 20:
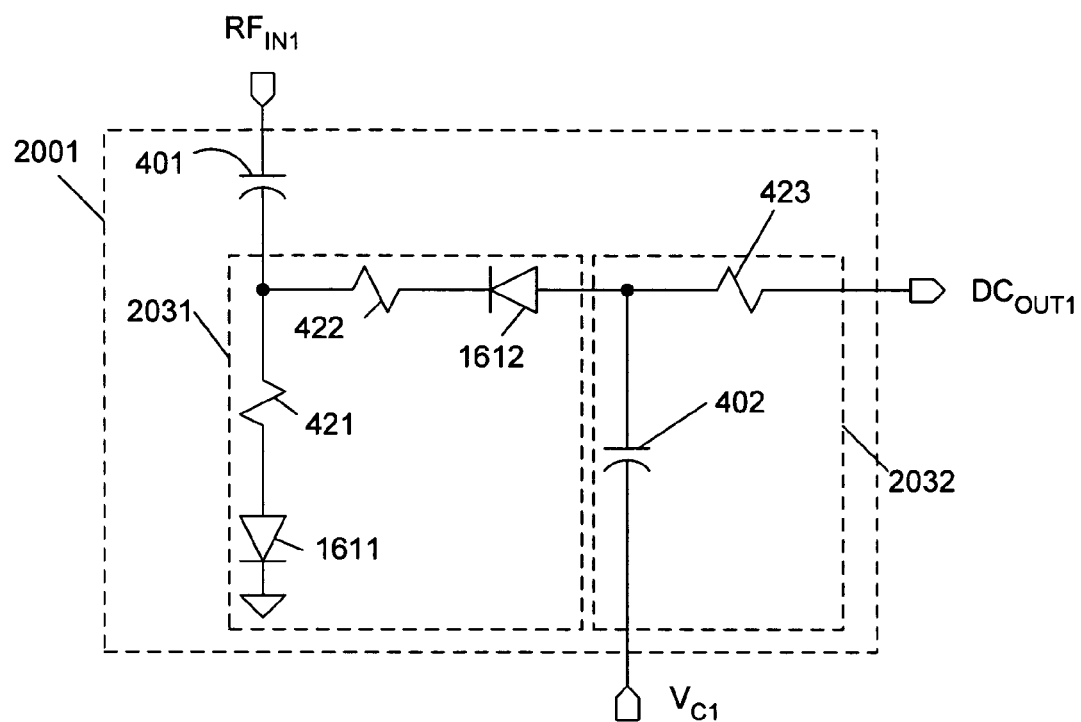

FIG. 20 is a circuit diagram of DC boost circuit 2001, in accordance with another embodiment of the present invention. DC boost circuit 2001 is similar to DC boost circuit 1601. However, the anode of diode element 1611 is coupled to receive the ground supply voltage, rather than the $V_{C1}$ voltage. The connection of diode element 1611 to the ground voltage supply makes this configuration slightly more complex. This configuration results in rectifier circuit 2031 and bias extractor 2032.

Figure 21:
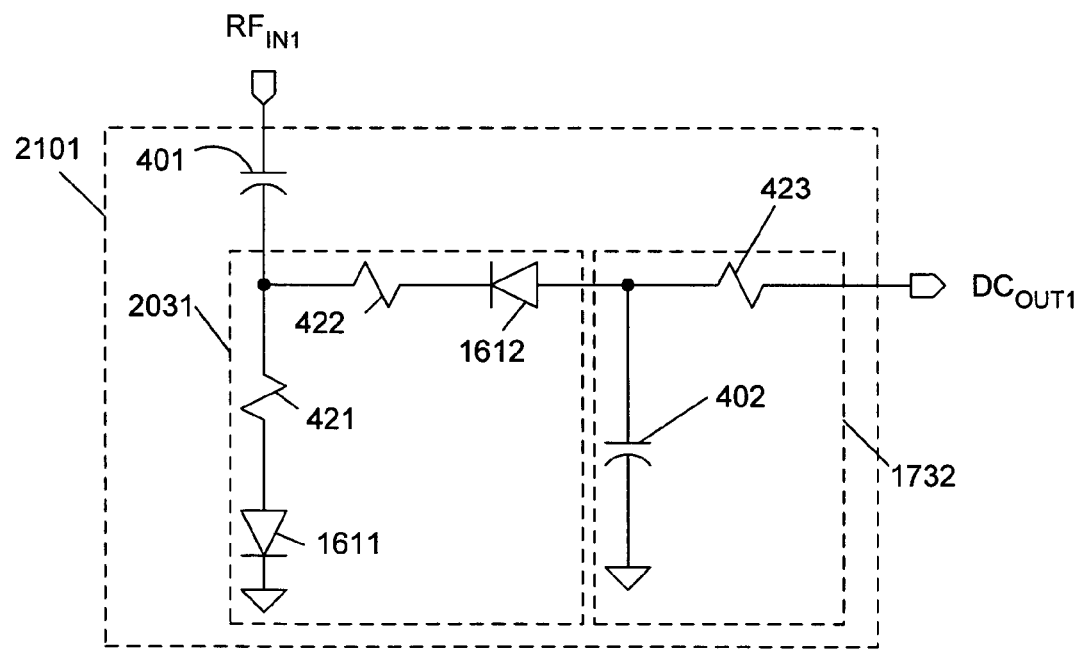

FIG. 21 is a circuit diagram of DC boost circuit 2101, in accordance with another embodiment of the present invention. DC boost circuit 2101 is similar to DC boost circuit 2001. However, capacitor 402 is coupled to receive the ground supply voltage, rather than the $V_{C1}$ voltage. Thus, DC boost circuit 2101 implements rectifier circuit 2031 and bias extractor 1732. Advantageously, DC boost circuit 2101 does not require a DC control voltage $V_{C1}$. DC boost circuit 2101 can be coupled to switch element 211 in the same manner as DC boost circuit 1401 (FIG. 14).

Figure 22:
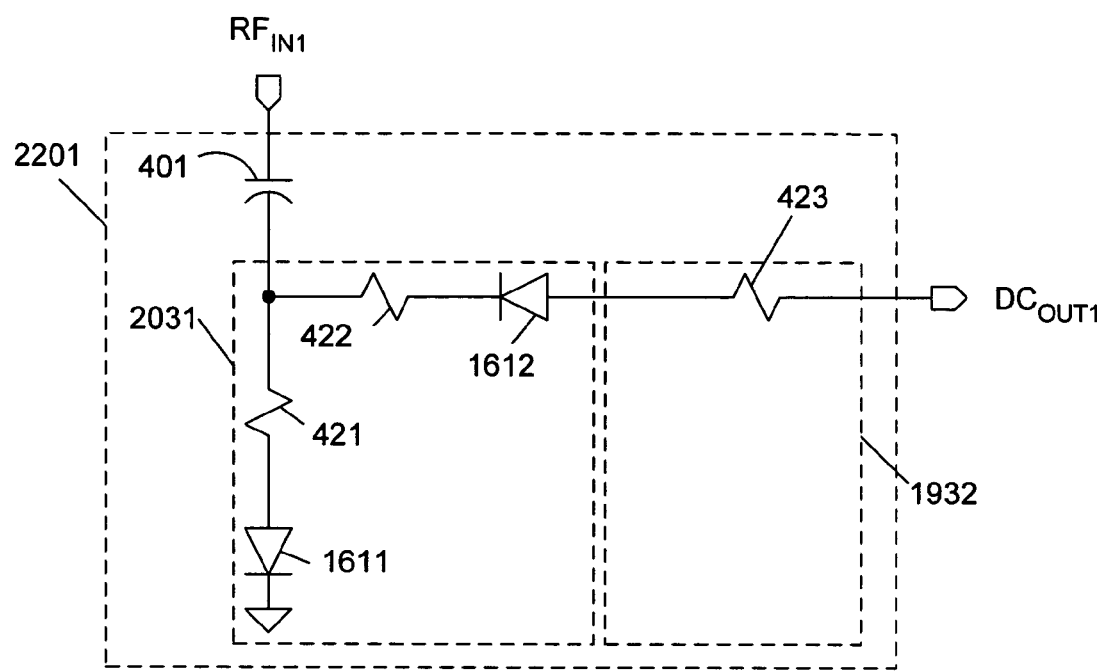

FIG. 22 is a circuit diagram of DC boost circuit 2201, in accordance with another embodiment of the present invention. DC boost circuit 2201 is similar to DC boost circuit 2101. However, capacitor 402 is eliminated is eliminated from DC boost circuit 2201. In this embodiment, the capacitance of the load (e.g., the gate capacitances of transistors 114-116) is used to replace capacitor 402. Advantageously, DC boost circuit 2201 does not require a DC control voltage $V_{C1}$.

The present invention includes a bias circuit comprising: a rectifier having a rectifier input, a DC control voltage input and a rectifier output, wherein the rectifier is configured to produce the rectifier output, while providing a substantially high input impedance at the rectifier input, a rectified voltage from an alternating input signal applied at the rectifier input; and a bias extractor having an extractor input, a control voltage input and an extractor output, coupled to the rectifier output, and being configured to produce at the extractor output a DC voltage that is greater in magnitude than the DC control voltage input.

Although the invention has been described in connection with several embodiments, it is understood that this invention is not limited to the embodiments disclosed, but is capable of various modifications, which would be apparent to one of ordinary skill in the art.

I claim:

1. A switch system comprising:
   a radio frequency switch element configured to receive a radio frequency (RF) input signal;
   a first voltage supply terminal configured to receive a first DC supply voltage;
   a boost circuit configured to receive the RF input signal and the first DC supply voltage and, in response, provide a DC output voltage that allows the RF input signal to be routed through the switch element, wherein the DC output voltage is greater than the first DC supply voltage, and wherein the first DC supply voltage is greater than zero volts.

2. The switch system of claim 1, wherein the boost circuit comprises:
   a first capacitor having a first terminal coupled to receive the RF input signal; and
   a rectifier circuit coupled to a second terminal of the capacitor and the first voltage supply terminal, wherein the rectifier circuit is configured to provide the DC output voltage in response to the RF input signal and the first DC supply voltage.

3. The switch system of claim 2, wherein the rectifier circuit comprises a first diode and a first resistor coupled in series between the first voltage supply terminal and the second terminal of the first capacitor.

4. The switch system of claim 3, wherein the rectifier circuit further comprises a second diode and a second resistor coupled in series between the second terminal of the first capacitor and the switch element.

5. The switch system of claim 4, further comprising a second capacitor coupled between the first voltage supply terminal and the switch element.

6. The switch system of claim 5, wherein the second capacitor and the series-connected second diode and second resistor are coupled at a first node, and further comprising a third resistor coupled between the first node and the switch element.

7. The switch system of claim 4, further comprising a second capacitor coupled between a second voltage supply terminal and the switch element.

8. The switch system of claim 7, wherein the second capacitor and the series-connected second diode and second resistor are coupled at a first node, and further comprising a third resistor coupled between the first node and the switch element.

9. The switch system of claim 4, further comprising a second capacitor and a third resistor connected in parallel between the second diode and the switch element.

10. The switch system of claim 4, further comprising a third resistor coupled in series with the second resistor and the second diode.

11. The switch system of claim 4, wherein a cathode of the first diode and an anode of the second diode are coupled to the second terminal of the first capacitor.

12. The switch system of claim 4, wherein an anode of the first diode and a cathode of the second diode are coupled to the second terminal of the first capacitor.

13. The switch system of claim 3, wherein a cathode of the first diode is coupled to the second terminal of the first capacitor.

14. The switch system of claim 3, wherein an anode of the first diode is coupled to the second terminal of the first capacitor.

15. A method of controlling a radio frequency (RF) switch comprising:
  applying an RF input signal to the RF switch and a boost circuit;
  applying a first DC supply voltage to the boost circuit;
  generating a DC output voltage in response to the first DC supply voltage and the RE input signal, wherein the DC output voltage is greater than the first DC supply voltage, and wherein the first DC supply voltage is greater than zero volts; and
  controlling the RF switch with the DC output voltage, wherein the DC output voltage allows the RF input signal to be routed through the RF switch.

16. The method of claim 15, wherein the step of generating the DC output voltage comprises charging and discharging a first capacitor in response to the first DC supply voltage and the RF input signal.

17. The method of claim 16, wherein the step of generating the DC output voltage further comprises charging and discharging a second capacitor in response to the first DC supply voltage and the RF input signal.

18. The method of claim 16, wherein the step of generating the DC output voltage further comprises charging and discharging a second capacitor in response to a second DC supply voltage and the RF input signal.

19. A switch system comprising:
  a radio frequency switch element configured to receive a radio frequency (RF) input signal and a first DC supply voltage;
  a first voltage supply terminal configured to receive the first DC supply voltage;
  a boost circuit configured to receive the RF input signal and the first DC supply voltage and, in response, provide a DC output voltage for controlling the switch element, wherein the DC output voltage is greater than the first DC supply voltage, and wherein the first DC supply voltage is greater than zero volts.

* * * * *